United States Patent [19]

Marumo et al.

[11] Patent Number: 5,525,911
[45] Date of Patent: Jun. 11, 1996

[54] VERTICAL PROBE TESTER CARD WITH COAXIAL PROBES

[75] Inventors: Hiroshi Marumo; Satoru Yamashita, both of Kofu; Nobuyuki Negishi, Tokyo; Shoichi Kanai, Shimonita-machi, all of Japan

[73] Assignees: Tokyo Electron Limited, Tokyo; Tokyo Electron Yamanashi Limited, Yamanashi; Junkosha Co., Ltd., Tokyo, all of Japan

[21] Appl. No.: 283,900

[22] Filed: Aug. 4, 1994

[30] Foreign Application Priority Data

Aug. 4, 1993 [JP] Japan .................................. 5-193339
Aug. 4, 1993 [JP] Japan .................................. 5-193340

[51] Int. Cl.⁶ .......................... G01R 31/02; G01R 1/073
[52] U.S. Cl. .................................... 324/754; 324/761
[58] Field of Search .................... 324/754, 72.5, 324/758, 765, 761; 174/88 C

[56] References Cited

U.S. PATENT DOCUMENTS 4,931,726  6/1990  Kasukabe et al. .................. 324/754

FOREIGN PATENT DOCUMENTS 63-28862  6/1988  Japan .
64-73632  3/1989  Japan .
2-28828   6/1990  Japan .

*Primary Examiner*—Ernest F. Karlsen
*Assistant Examiner*—Russell M. Kobert
*Attorney, Agent, or Firm*—Oblon, Spivak, McClelland, Maier & Neustadt

[57] ABSTRACT

A probe card is electrically connected to a tester, electrically contacted and connected to circuits to be tested, and used to transmit test signals between the tester and the circuits. It includes a plate assembly having a printed board and an earth plate insulated from each other. Probe assemblies are supported by the plate assembly and are substantially vertically contacted at their foremost ends with pads of the circuits to be tested. Each probe assembly includes a center conductor having a sharpened tip contacted with the pad of the circuit to be tested. A holder conductor shrouds the center conductor while leaving the front end portion thereof not enclosed, and having electrical continuity with the center conductor. A dielectric shrouds the holder conductor, a peripheral conductor coaxially arranged around the holder conductor with the dielectric interposed between them, and a sheath enclosing the peripheral conductor. The upper end of the holder conductor is electrically connected to a circuit on the printed board while the upper end of the peripheral conductor is electrically connected to a circuit on the earth plate.

17 Claims, 4 Drawing Sheets

VERTICAL PROBE TESTER CARD WITH COAXIAL PROBES

BACKGROUND OF THE INVENTION

1. Field of the Invention

The present invention relates to a probe card, coaxial probes for the probe card, and a method of making them, which are used by a probe device for checking electric characteristics of semiconductor devices, for example. More particularly, it relates to a multi-pins and high density probe card of the vertical probe type (which will be hereinafter referred to as VTPC).

2. Description of the Related Art

A typical probe device is disclosed in Jpn. Pat. Appln. KOKAI Publication No. Sho 64-73632, for example. The probe card for this device has probes obliquely contacted with pads to be tested. As the semiconductor devices are made more highly integrated, however, the number of pads per chip is made larger and the pad is made smaller in size while the interval between the pads is also made smaller. The conventional probe card of the tilted probe type, therefore, cannot meet these semiconductor devices.

Instead of the probe card of the tilted probe type, therefore, a VTPC disclosed in Jpn. Pat. Appln. KOKOKU Publication Nos. Hei 2-28828 and Sho 63-28862 is now becoming practical. In this VTPC, the number of probes mounted can be increased to a greater extent and their mounting pitch can be made smaller.

In the VTPC, however, attention is paid not to characteristic impedance and shield quality of each probe but to making each probe super-slender and mounting a plurality of them on the probe card at a micro-pitch. Therefore, signal reflection is caused in the probe and cross talk (or a kind of noise) is caused between adjacent probes because the characteristic impedance of the probe is not matched with that of a tester. As the result, abnormal ringing is caused in signals transmitted to thereby add bad influence to the probing test.

A coaxial cable is more advantageous in that less noise enters into signals transmitted and that the characteristic impedance of the cable is stable. It is therefore expected that various kinds of merit can be obtained when the coaxial cable is used for wiring in the probe card. However, a peripheral conductor (such as the shield) of the cable must be earthed on a print plate but the print plate cannot produce any space for such earth connection.

The probe which has been shield-processed like the coaxial cable comes to have an outer diameter of about 0.8 mm. In a case where the print plate for the common VTPC is used, however, each pattern electrode to which the upper end portion of a probe member in each probe is soldered must be arranged on the print plate at a quite small pitch of about 1 mm–1.5 mm. It is therefore impossible from the viewpoint of space that an earth conductive layer (or ground) to which the upper end portion of an outer conductor (such as the shield) of each probe is soldered is formed on a same plane as the pattern electrodes and between them arranged at such small pitch, while keeping an insulating distance relative to them.

In a case where frequencies of test signals are in a high frequency region, signals are reflected and noise is caused when signals pass through those signal transmitting passages which have a characteristic impedance different from that of the tester. Therefore, characteristic impedances of probes through which signals are transmitted must be matched with that of the tester. In short, impedance matching must be carried out.

SUMMARY OF THE INVENTION

An object of the present invention is therefore to provide a VTPC and a method for the same capable of reducing the reflection of a signal transmitted from the tester, suppressing cross talk and preventing abnormal ringing from being caused to obtain a more excellent testing characteristic.

Another object of the present invention is to provide a coaxial probe more suitable for use with the VTPC which has some merits as describe above, and also to provide a method of making the same.

A further object of the present invention is to provide a method of processing upper end portions of coaxial cables mounted on the VTPC at a higher density to enhance their testing quality to a greater extent.

According to an aspect of the present invention, there can be provided a probe card electrically connected to a tester, electrically contacted and connected to circuits to be tested, and used to transmit test signals between the tester and the circuits comprising a plate assembly having print and earth plates insulated from each other; and probe assemblies supported by the plate assembly and substantially vertically contacted at their foremost ends with pads of the circuits to be tested, each probe assembly including a center conductor whose a tip portion (sharpened tip) is contacted with the pad of the circuit to be tested, a holder conductor enclosing the center conductor while leaving the front end portion thereof not enclosed, having continuity with the center conductor, a dielectric enclosing the holder conductor, a peripheral conductor coaxially arranged round the holder conductor with the dielectric interposed between the peripheral conductor and the holder conductor, and a sheath enclosing the peripheral conductor, wherein the upper end of the holder conductor is electrically connected to a circuit on the print plate while the upper end of the peripheral conductor to a circuit on the earth plate.

According to another aspect of the present invention, there can be provided a probe used to transmit signal between a tester and a circuit to be tested comprising a center conductor having a tip portion substantially vertically contacted with a pad of the circuit; a holder conductor enclosing the center conductor while leaving a front end portion thereof not enclosed, and having continuity with the center conductor; a dielectric enclosing the holder conductor; a peripheral conductor coaxially arranged round the holder conductor with the dielectric interposed between them; and a sheath enclosing the peripheral conductor; wherein an upper end of the holder conductor is electrically connected to a circuit on a print plate while an upper end of the peripheral conductor to an earth plate.

According to a further object of the present invention, there can be provided a probe for the probe card comprising a center conductor having a foremost end substantially vertically contacted with a pad of a circuit to be tested; a holder conductor enclosing the center conductor while leaving a front end portion thereof not enclosed, and having continuity therewith; a dielectric enclosing the holder conductor; a peripheral conductor coaxially arranged round the holder conductor with the dielectric interposed between them; and a sheath enclosing the peripheral conductor; wherein an upper end of the holder conductor is electrically connected to a circuit on a print plate while an upper end of the peripheral conductor to an earth plate.

According to a still further object of the present invention, there can be provided a method of making a probe card comprising forming a first coaxial cable having a characteristic impedance smaller than that of a tester while calculating the characteristic impedance from some equations; coating a dummy core line with a layer of dielectric; covering the dielectric layer with a conductive mesh; coating the conductive mesh with a sheath to thereby form the first coaxial cable having a characteristic impedance smaller than that of the tester; pulling the dummy core line out of the first coaxial cable to form a center hole in the cable; forming a second coaxial cable while passing the center conductor through the center hole in the first coaxial cable in such a way that both end portions of the center conductor are projected from both ends of the first coaxial cable, the center conductor having a diameter smaller than that of the dummy core line; electrically connecting upper end portions of the center conductors to circuits on a print plate while electrically connecting upper end portions of the conductive meshes to an earth plate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Some embodiments of the present invention will be described in detail with reference to the accompanying drawings.

Figure 1:
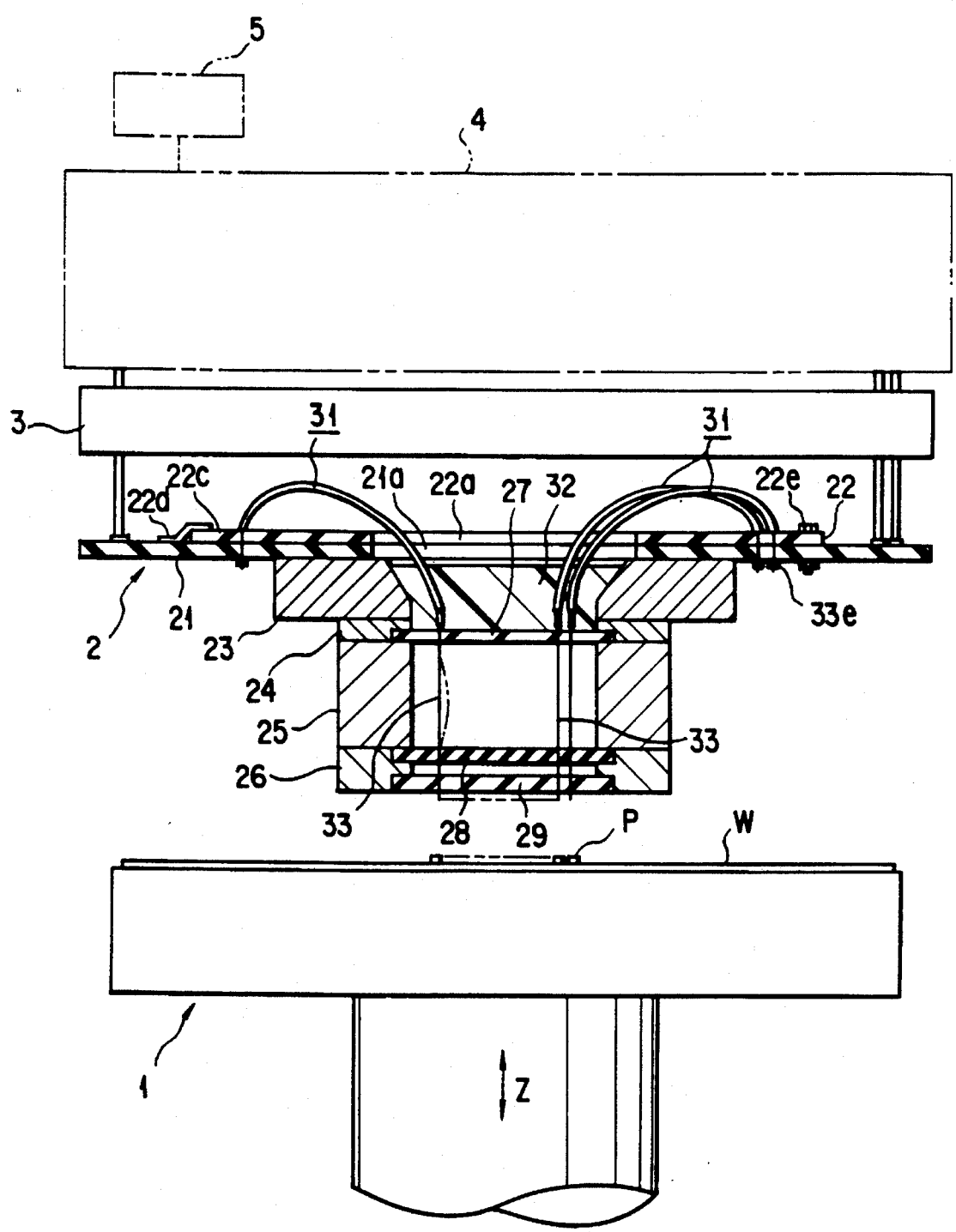
FIG. 1 is a vertically-sectioned view showing the probe card according to an embodiment of the present invention.

As shown in FIG. 1, a wafer-mounted stage 1 is arranged substantially at the center of an automatic probe device base (not shown). It is on a table (not shown) which can move along axes X, Y, Z and rotate round an axis θ. It has a wafer chuck mechanism (not shown) for sucking and holding a sheet of wafer W on it.

A VTPC 2 is opposed to the top of the wafer-mounted stage 1. It is supported by a card holder (not shown), which is fixed and supported by a head plate (not shown) and an insert ring (not shown). A contact ring 3 and a test head 4 are arranged above it. The contact ring 3 includes a performance board (not shown) and an interface block (not shown). Allotting of pin electronics and wiring of a power ground are added to the performance board. The interface block has cables and pogo-pins for connecting the VTPC 2 and the performance board to each other.

The contact ring 3 is electrically connected to the test head 4 by a measuring interface which comprises cables and pogo-pins. The contact ring 3 and the test head 4 are electrically connected to an external tester 5 by cables and pogo-pins.

Figure 2:
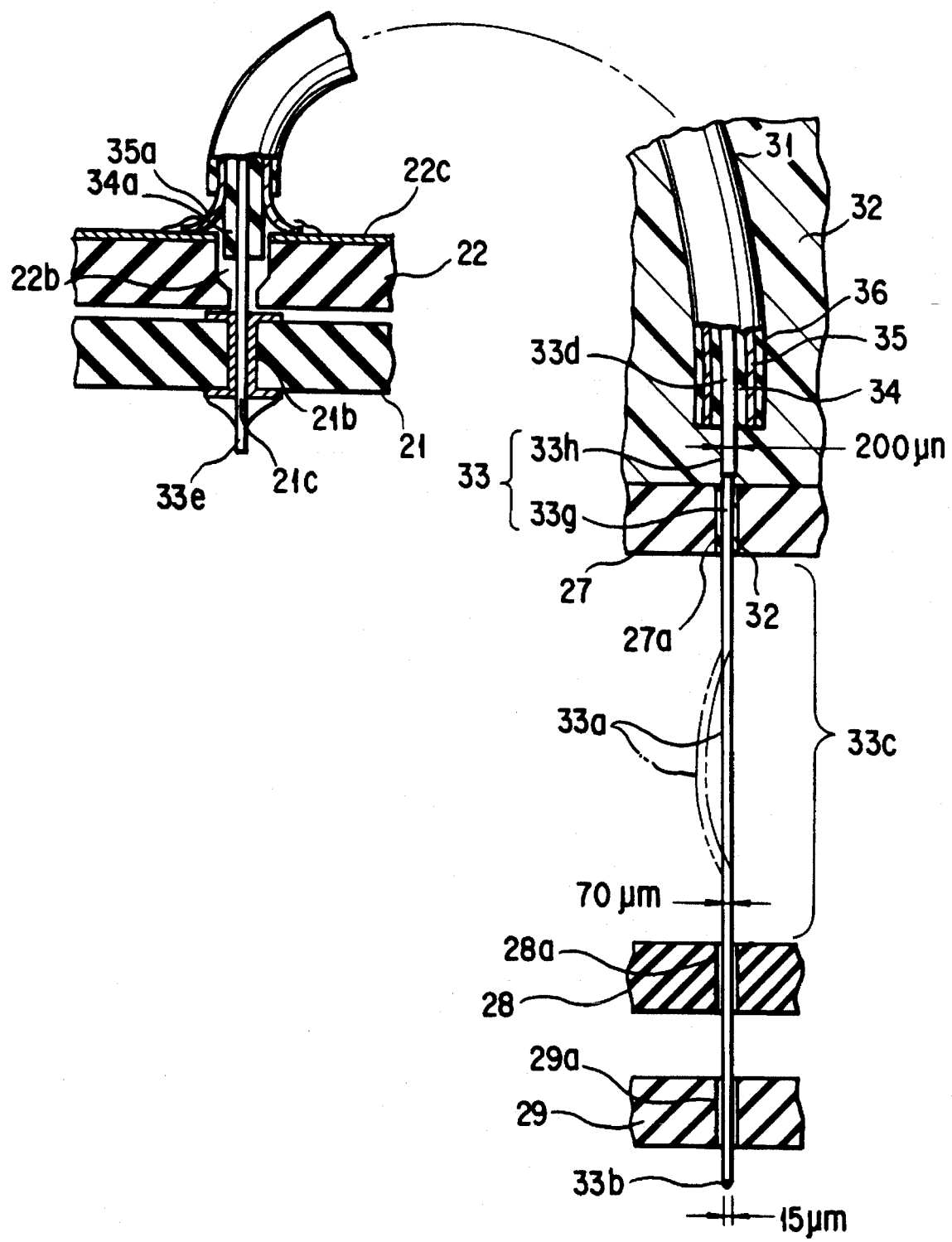
FIG. 2 is a vertically-sectioned view showing a part of the probe card enlarged.

The VTPC 2 will be described referring to FIGS. 1 and 2.

The VTPC 2 is an assembly of printed board 2, earth plate 22, fixing blocks 23, 24, 25, 26, a distribution (or fixing) plate 27, guide plates 28, 29 and a plurality of coaxial probes 31. A plurality of circuits are formed on the printed board 21, corresponding to the coaxial probes 31. Formed in the center of the 21 is an opening 21a through which the coaxial probes 31 pass. A plurality of through-electrodes 21b are connected to circuits on the top and bottom of the printed board 21. Each through-electrode 21b has a through-hole 21c through which a probe member 33 passes. The through-hole 21c has a diameter of 250–500 μm. The through-electrodes 21b are arranged in the printed board 21 at a pitch interval of 1 mm–1.5 mm.

The earth plate 22 is mounted on the printed board 21 and they are connected to each other by lead terminals 22d and screws 22e. The earth plate 22 is insulated from the printed board 21. A sheet of thin copper foil 22c is bonded to the top of the earth plate 22. The lead terminal 22d serves to electrically connect the conductive layer 22c to a ground pattern on the board 21. Formed in the center of the earth plate 22 is an opening 22a through which the coaxial probes 31 pass. Through-holes 22b are formed in the earth plate 22, corresponding to those 21c in the 21. Each through-hole 22b is a stepped one (or spot facing one), having a relatively larger diameter at its upper half.

The ring-shaped fixing blocks 23, 24, 25 and 26 are coaxially mounted one upon the others in this order on the bottom (or underside) of the 21 by positioning pins and screws (not shown). The upper fixing block 24 holds the distribution plate 27 at the center thereof. The lower fixing block 26 holds two guide plates 28 and 29 at the center thereof. The distribution and guide plates 27, 28 and 29 are arranged parallel to one another. They are made of insulating resin and they have a plurality of through-holes 27a, 28a and 29a formed at a same pattern.

Center areas of the upper fixing blocks 23 and 24 are filled with adhesive 32 of the epoxy group. The coaxial probes 31 are fixed to the distribution plate 27 and the fixing blocks 23, 24 by this adhesive 32. A front end portion 33a of each coaxial probe 31 is not fixed to the guide plates 28 and 29. When its foremost end 33b is strongly pushed against a pad P, therefore, its front end portion 33a is made flexible.

A plurality of the coaxial probes 31 (practically about 1500–2000 probes in an area of about 15 mm$^2$) according to the present invention are attached to the probe card 2 as described above.

A center conductor 33g of each probe member 33 is made of alloy of gold and copper (Au-Cu) to reduce its contact resistance and enhance its durability. The front end portion 33a has a length of about 15–20 mm and its flexible section 33c (between the fixing plate 27 and the guide plate 28) has a length of about 10 mm. The foremost end 33b projects about 250 μm downward from the lower guide plate 29.

A dielectric (or inner insulator) 34 is made of FEP, having a thickness of 0.158 mm and an outer diameter of about 0.57 mm. A conductor 35 (such as shield) round the dielectric 34 is a braided shield strand made of tin-plated soft copper. A sheath (or outer insulator coating) 36 is made of polyester film, having thickness of 0.025 mm and an outer diameter of about 0.8 mm when finished. When these materials and sizes are combined with one another, the characteristic impedance (about 50Ω) of the coaxial probe 31 can be matched with that of the tester 5.

The probing test is conducted relative to chips on the semiconductor wafer W as follows:

The wafer W is mounted on the wafer-mounted stage 1, which is then moved in the directions X, Y, Z and O to contact the sharpened tip 33b of each probe 31 with a pad P on each chip. Overdrive is added this time to keep the sharpened tips 33b surely contacted with the pad P. Test signal is transmitted from the tester 5 to each probe 31 through the contact ring 3 and the test head 4.

Figure 3:
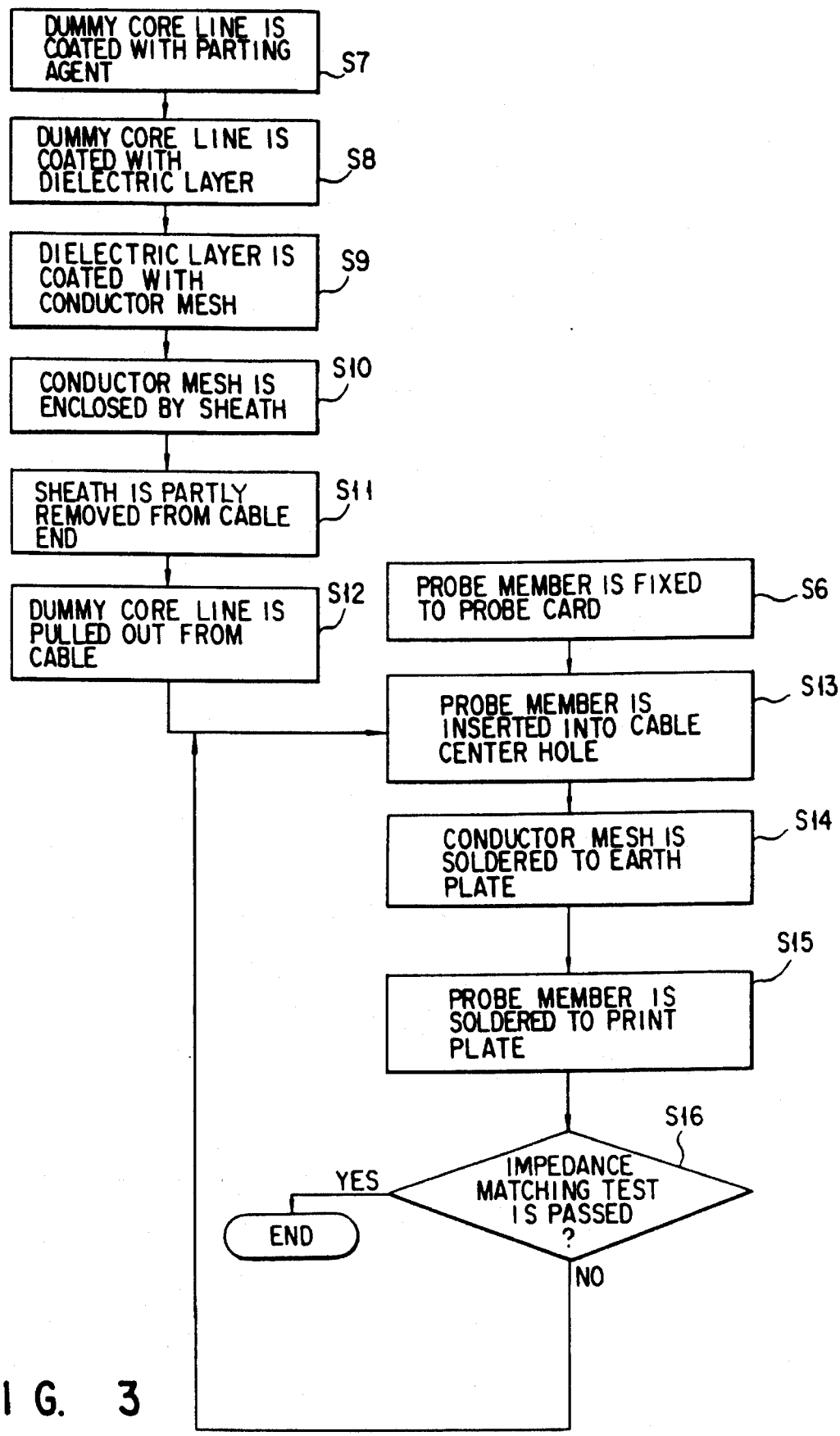
FIG. 3 is a process chart showing methods of making a probe and a coaxial cable and a method of processing the upper end portion of each coaxial cable.

Referring to FIG. 3, it will be described how the probe card is made.

The probe member 33 consists of a center conductor 33g having an average diameter of 70 μm and a holder tube 33h having an outer diameter of 200 μm, said holder tube 33h covering the outer surface of the center conductor 33g. The tip portion 33a of the probe member 33 is about 20 mm long, and has a sharpened tip 33b having a diameter of about 15 μm.

The distribution plate 27 and the two guide plates 28, 29 are set parallel to each other while keeping them separated from one another. These plates 27, 28 and 29 are parts or components for forming the probe card 2. They have a plurality of through-holes 27a, 28a and 29a, which are aligned with one another to have a same center axis. The front end portion 33a of the probe member 33 is passed through the through-holes 27a, 28a and 29a. It is projected from the guide plate 29 only by a predetermined length. Each of probe members 33 is performed a short-circuit test. The through-hole 27a in the plate 27 is then filled with adhesive to fix the probe member 33 to the distribution plate 27 (Step S6).

Figure 4:
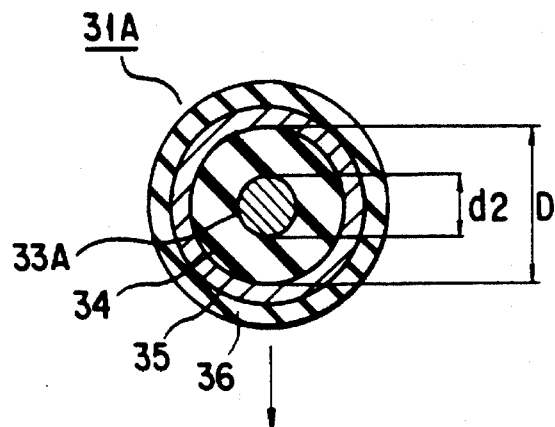
FIG. 4 is a horizontally-sectioned view showing a coaxial cable (or an intermediate product) provided with a dummy core line therein.
Figure 5:
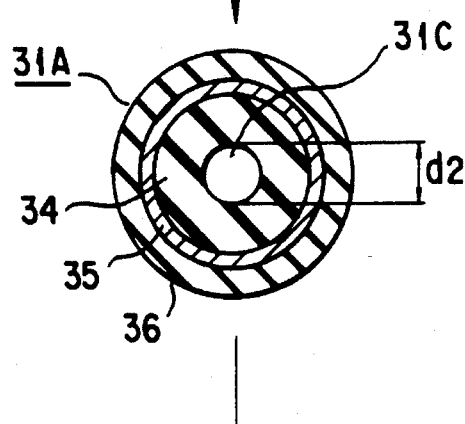
FIG. 5 is a horizontally-sectioned view showing the coaxial cable from which the dummy core line has been removed.
Figure 6:
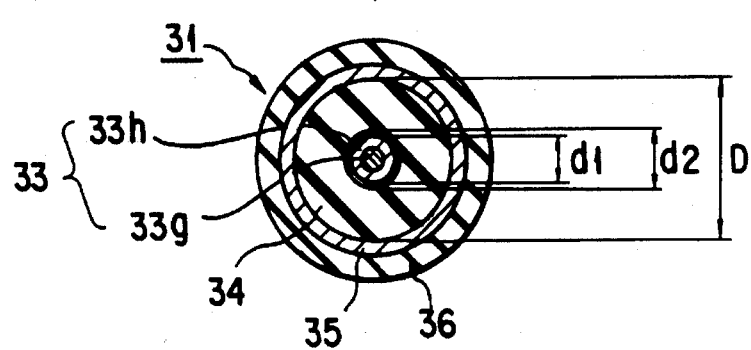
FIG. 6 is a horizontally-sectioned view showing the coaxial cable (or a finished product) provided with a center conductor therein.

Referring to FIGS. 4 through 6 and steps 7–12 in FIG. 3, it will be described how the coaxial cable 31 is made.

A dummy core 33A is coated with parting agent (Step S7). It is passed through molten FEP (fluorinated ethylene propylene) and cooled. It is thus coated with the dielectric 34 (Step S8). The dielectric 34 has an average thickness of 0.158 mm and an average outer diameter 0.57 mm.

The dielectric 34 is further coated with a conductive mesh (or enclosing conductor) 35 (Step S9). The conductive mesh 35 is made by braiding tin-plated copper lines each having a diameter of 0.05 mm. It is bonded to the dielectric 34 not to come into pieces.

When the conductive mesh 35 is further coated with the sheath 36 which has an average thickness of 0.025 mm, an intermediate cable 31A is made as shown in FIG. 4 (Step S10). The sheath 36 is made of polyester film. The intermediate cable 31A has an average outer diameter of 0.8 mm.

The sheath 36 of the cable 31A is partly removed to expose an end portion of the dummy core 33A (Step S11).

When the dummy core 33A is then pulled off from the cable 31A. The cable 31A comes to have a center hole 31c, as shown in FIG. 5 (step S12). The center hole 31c has an average diameter of 254 μm.

The large-diameter portion of the probe member 33 is projected upward from the distribution plate 27. This portion is inserted into the center hole 31c of the cable 31A (Step S13). The coaxial cable 31 is thus formed as shown in FIG. 6.

It will be described how the upper end portion of the coaxial cable 31 is treated.

Upper ends of the coaxial cables 31 are cut away to project 80–100 mm upward from the distribution plate 27. The sheath 36 is partly removed from the upper end portion of each coaxial cable 31 to expose the conductive mesh 35. This exposed conductive mesh 35 and the dielectric 34 are further partly removed to expose the probe member 33 as an upper end portion of the coaxial cable 31. The probe member 33 thus exposed has a length of 70–90 mm. The conductive mesh exposed has a length of 10–30 mm.

Each coaxial cable 31 is curved like U and its upper end portion is passed through the stepped hole 22b in the earth plate 22. It portion exposed downward from the plate 22 is further passed through the hole of pattern electrode 21b in the printed board 21 and projected downward from the printed board 21 by an appropriate length. The exposed conductive mesh 35 is soldered to the conductive layer 22c on the top of the earth plate 22 (Step S14). On the other hand, a front end portion 33e projected is soldered to the pattern electrode 21b (Step S15).

Figure 7:
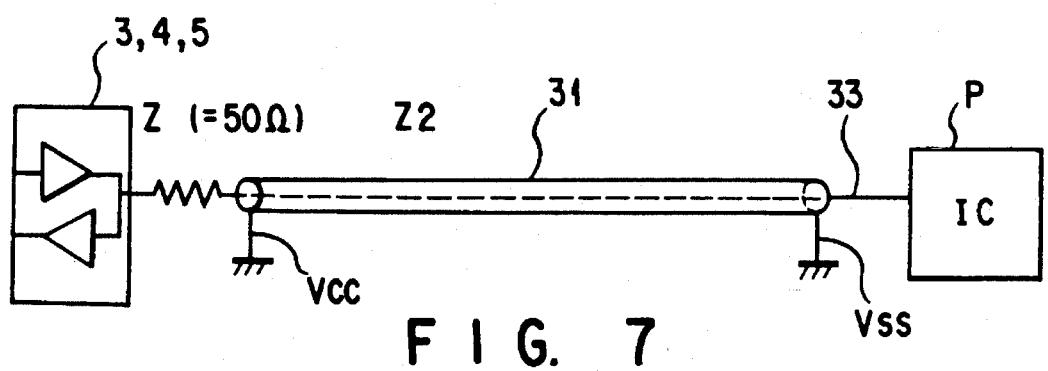
FIG. 7 is a circuit diagram showing a signal transmitting circuit in the probe card to explain impedance matching.

As shown in FIG. 7, the conductive mesh side becomes VSS minus while the probe member side VCC plus. To prevent the reflection of signals transmitted through each probe, the characteristic impedance $Z_2$ of the probe member side is made equal to that Z of the tester side and reflection coefficient ρ ($=(Z_2-Z)/(Z_2+Z)$) is made zero. While keeping the characteristic impedance Z of the tester side at a predetermined value (50Ω, for example), the one $Z_2$ of the probe member side is measured and changed. In short, impedance matching is carried out to match both of them with each other (Step S16). When the result of the impedance matching test is "YES", the probe can be a complete one as test sample. When the result is "NO", however, the operation is brought back to step S13 for renewing the coaxial cable. Measuring and adjusting of the characteristic impedance $Z_2$ are repeated until the probe member stands the impedance matching test, that is, it has the result "YES" (Steps S13 to S16).

The impedance matching will be described using the following equations (1), (2) and (3).

The equation (1) is used to calculate the characteristic impedance $Z_0$ (Ω) of usual high frequency coaxial cables. Dielectric constant, material and thickness of the dielectric 34 are selected on the basis of the equation (1) to make a coaxial cable 31A having a characteristic impedance (about 37Ω) smaller than a desired one (50Ω).

$$Z_0 = \frac{138}{\sqrt{Er}} \log_{10} \frac{D + 1.0\, dw}{K_1 d} \quad (\Omega) \qquad (1)$$

wherein d represents an outer diameter (mm) of the center conductor, $K_1$ an effective diameter parameter of the center conductor, D an outer diameter (mm) of the dielectric, Era dielectric constant of the dielectric, and dw a diameter of the braided shield strand.

The dummy center conductor 33A is made of tin-plated soft copper. Its outer diameter $d_2$ is 0.254 mm and its effective diameter parameter $K_1$ is 1.

The dielectric (or inner insulator) is made of FEP which has a dielectric constant Er of 2.1, its inner diameter is 0.254 mm, its thickness is 0.158 mm and its outer diameter D is 0.57 mm.

The outer conductor (such as the shield) 35 comprises 35 shield strands braided and made of tin-plated soft copper. The strand has a diameter dw of 0.05 mm, and it is tin-plated to have a density higher than 90% and an average outer diameter of 0.67 mm.

The sheath (or outer insulator coating) 36 has a thickness of 0.025 mm and a finished outer diameter of 0.72 mm, and it is made of polyester film (mil-ene).

Therefore, the characteristic impedance $Z_1$ of the dummy coaxial cable 31A can be calculated from the following equation (2).

$$Z_1 = \frac{138}{\sqrt{Er}} \log 10 \frac{D + 1.0\, dw}{K_1 d_2} \quad (2)$$

$$= \frac{60}{\sqrt{Er}} \ln \frac{D + 1.0\, dw}{K_1 d_2}$$

$$= \frac{60}{\sqrt{2.1}} \ln \frac{0.75 + 1.0 \times 0.05}{1 \times 0.254} = 36.8 \approx 37\ (\Omega)$$

The coaxial cable 31A is made, as described above, to have an impedance of about 37Ω. The dummy center conductor 33A is pulled out of the coaxial cable 31A to form the center hole in the coaxial cable 31A, as shown in FIG. 5. The conductive probe 33 having a diameter $d_1$ of 200 μm a little smaller than that of the center hole in the coaxial cable 31A is passed through the center hole to thereby form the coaxial probe 31. An effective dielectric constant Ee of the dielectric 34 is obtained at first, using the following equation (3). The characteristic impedance $Z_2$ of the coaxial probe 31 is then calculated, putting Ee thus obtained into the equation (2).

$$Ee = \frac{EA\ EB\ \ln (D/d1)}{EA \ln ((D/d_2) + EB \ln (d_2/d_1))} \quad (3)$$

wherein EA=1, EB=2.1

$$Ee = \frac{1 \times 2.1 \times \ln (0.57/0.2)}{1 \times \ln (0.57/0.254) + 2.1 \times \ln (0.254/0.2)}$$

$$= \frac{2.20}{0.91 + 0.51} = 1.67$$

$$Z_2 = \frac{138}{\sqrt{Ee}} \log 10 \frac{D + 1.0\, dw}{K_1 d_1}$$

$$= \frac{60}{\sqrt{Ee}} \ln \frac{D + 1.0\, dw}{K_1 d_1}$$

$$= \frac{60}{\sqrt{1.67}} \ln \frac{0.57 + 1.0 \times 0.05}{1 \times 0.2} = 52.5\ (\Omega)$$

The coaxial probe 31 can be thus obtained, having the characteristic impedance $Z_2$ matched with the one Z of the tester side.

When a plurality of these coaxial probes 31 are attached to the probe card 2, the reflection of signals transmitted can be reduced to a greater extent. Further, cross talk can be suppressed and abnormal ringing can be prevented even if the probe members 33 are arranged on the probe card 2 at a micro-pitch. A more excellent testing characteristic can be thus obtained.

The probe member 33 has a diameter smaller than that of the dummy core line 33A. It can be thus more smoothly passed through the center hole in the coaxial cable 31A. In addition, it can be made independently of the coaxial cable 31A. This enables its foremost end 33b to be more easily polished. Therefore, its assembly and process can be made easier and it needs no troublesome after-process.

The coaxial cable 31A is made at first, having a characteristic impedance (37Ω) a little smaller than the intended one (50Ω), and the dummy center conductor 33 is then replaced by the conductor 33. Therefore, the coaxial probe 31 having the intended characteristic impedance (50Ω) can be more easily obtained.

According to the above-described embodiment, the upper end of each coaxial probe 31 can be processed at the earth plate 22 and the top space of the printed board 21 can be thus more effectively used. Therefore, a VTPC having a larger number of pins can be more easily made.

Further, each hole 22b in the earth plate 22 has a larger diameter at its upper half than at its lower half. Therefore, the foremost end 33e of the exposed probe member 33 can be more easily guided into the hole 21c in the printed board 21 without contacting the exposed probe member 33 with the conductive layer 22c on the earth plate 22. The connecting of components 33e and 35a to the plates 21 and 22 can be thus more easier to more reliably insulate the probe member 33 from the conductive layer 22c.

Furthermore, the reflection of signals in their transmitting lines can be reduced to a greater extent and abnormal ringing because of cross talk can be prevented. A more excellent testing characteristic can obtained accordingly.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A probe card electrically connected to a tester, electrically contacted and connected to circuits to be tested, and used to transmit test signals between the tester and the circuits comprising:

a plate assembly having a printed board and an earth plate insulated from each other, said earth plate having a conductor portion for ground connection and an insulating portion for insulating said conductor portion from said printed board; and probe assemblies supported by the plate assembly and substantially vertically contacted at their foremost ends with pads of said circuits to be tested, each probe assembly including a center conductor whose tip portion is contacted with the pad of the circuit to be tested, a holder conductor enclosing the center conductor while leaving the front end portion thereof not enclosed, having continuity with the center conductor, a dielectric enclosing the holder conductor, a peripheral conductor coaxially arranged around the holder conductor with the dielectric interposed between said peripheral conductor and the holder conductor, and a sheath enclosing the peripheral conductor, wherein the upper end of said holder conductor is electrically connected to a circuit on the printed board while the upper end of said peripheral conductor to the conductor portion of the earth plate.

2. The probe card according to claim 1, wherein said dielectric is made of fluorinated ethylene propylene.

3. The probe card according to claim 1, wherein said sheath is made of polyester film.

4. The probe card according to claim 1, wherein a stepped hole having a diameter larger on an inlet side than on an outlet side is made through said earth plate, and a proximal end portion of said holder conductor is inserted through said stepped hole.

5. The probe card according to claim 1, wherein the average outer diameter of said holder conductor is smaller than the average inner diameter of said dielectric.

6. The probe card according to claim 5, wherein said holder conductor have an average outer diameter of 200±20 um.

7. The probe card according to claim 5, wherein said dielectric has an average inner diameter of 254±20 um.

8. The probe card according to claim 1, wherein said earth plate is piled on the printed board, through-holes in said earth plate are positioned to correspond to those in said printed board, and the upper end of each holder conductor is passed through an electrode which encloses each through-hole in said printed board.

9. The probe card according to claim 1, wherein the upper end of each holder conductor is projected downward from the printed board.

10. The probe card according to claim 1, wherein the tip portion of said center conductor is exposed and apart from said conductor portion of the earth plate and is positioned close to each of the insulating portion of the earth plate and said printed board.

11. The probe card according to claim 1, wherein a terminal portion of said center conductor is soldered to a circuit of the printed board.

12. The probe card according to claim 1, further comprising:

a distribution plate for receiving each said center conductor stripped from each corresponding holder conductor of said probe assemblies;

guide means vertically offset from the distribution plate for receiving each said stripped center conductor from the distribution plate and for vertically guiding each stripped center conductor to a corresponding electrode pad on a semiconductor wafer during testing; and wherein, a flexible section in each said stripped center conductor is formed in an open space between the distribution plate and the guide means.

13. The probe card of claim 12, wherein the flexible section is several millimeters long.

14. The probe card of claim 1, wherein, the probe assemblies are impedance matched with the test board.

15. A probe used to transmit signal between a tester and a circuit to be tested comprising a center conductor having a tip portion substantially vertically contacted with a pad of said circuit;

a holder conductor enclosing the center conductor while leaving a front end portion thereof not enclosed, and having continuity with the center conductor;

a dielectric enclosing the holder conductor;

a peripheral conductor coaxially arranged round the holder conductor with the dielectric interposed between said peripheral conductor and the holder conductor; and a sheath enclosing the peripheral conductor;

wherein an upper end of said holder conductor is electrically connected to a circuit on a printed board while an upper end of said peripheral conductor to a circuit on an earth plate.

16. The probe card according to claim 15, wherein the tip portion of said center conductor is exposed and apart from said conductor portion of the earth plate and is positioned close to each of the insulating portion of the earth plate and said printed board.

17. The probe card according to claim 15, wherein a terminal portion of said center conductor is soldered to a circuit of the printed board.

* * * * *